United States Patent [19]

Pohl et al.

[11] 4,258,647

[45] Mar. 31, 1981

[54] APPARATUS FOR MANUFACTURING MULTI-LAYERED SEMICONDUCTOR ELEMENTS BY MEANS OF LIQUID-PHASE EPITAXY

[75] Inventors: Dieter W. Pohl, Adliswil; Hansjoerg Scheel, Kilchberg, both of Switzerland

[73] Assignee: International Business Machines Corporation, Armonk, N.Y.

[21] Appl. No.: 23,118

[22] Filed: Mar. 23, 1979

[30] Foreign Application Priority Data

Mar. 30, 1978 [CH] Switzerland .......................... 3455/78

[51] Int. Cl.$^3$ .......................... B05C 3/04; B05C 3/109
[52] U.S. Cl. ...................................... 118/52; 427/87; 427/241
[58] Field of Search ............................ 118/52, 54, 55; 427/240, 241, 87; 233/18

[56] References Cited

U.S. PATENT DOCUMENTS

| 450,391 | 4/1891 | Wahlin | 233/18 |
| 3,974,797 | 8/1976 | Hutson | 118/54 |
| 4,101,925 | 7/1978 | Kelley et al. | 118/52 X |

OTHER PUBLICATIONS

Grant, J., Hackh's Chemical Dictionary, 4th edition, New York, McGraw-Hill Book Company, 1972, p. 562.

Primary Examiner—Evan K. Lawrence
Attorney, Agent, or Firm—Henry Powers

[57] ABSTRACT

In a crucible or reactor for making multi-layered semiconductor devices by means of liquid-phase epitaxy, different supersaturated solutions are brought into contact with semiconductor substrates for short times. Transport of the solutions occurs by alternating acceleration. Either gravity alternates with centrifugal force, or a positive rotational acceleration alternates with a negative one. Chambers within the reactor are interconnected by channels so that the alternating forces acting upon the solutions cause these to flow in a preferred direction without mixing with each other.

12 Claims, 7 Drawing Figures

APPARATUS FOR MANUFACTURING MULTI-LAYERED SEMICONDUCTOR ELEMENTS BY MEANS OF LIQUID-PHASE EPITAXY

BACKGROUND OF THE INVENTION

In the manufacture of multi-layered elements, in particular of elements of III-V compounds like gallium arsenide, liquid-phase epitaxy becomes more and more employed. In contrast to elements on which semiconductor layers are deposited from the vapor-phase, life expectancy as well as efficiency are notably improved. For liquid-phase epitaxy, the surface of a substrate is brought into contact for a defined time with an oversaturated solution whereby a specific epitactic layer grows on the surface. In subsequent process steps, the same surface is brought into contact with another oversaturated solution in order to grow another epitactic layer. The process may be repeated many times. There is a trend in industry to ever thinner epitactic layers with ever-growing quality requirements. Thus, as the contact times between solution and surface decrease, the requirements as to purity of solutions, cleanliness of vessels, etc. increases. Also, it is necessary to remove one solution completely before the subsequent solution comes into contact with the surface. Finally, it is desirable to recover the solutions for further use, without contamination. Several implements and devices are already known in the art for the execution of multi-layered liquid-phase epitaxy. A first group of devices works with sliders which move between different chambers of a crucible which contain different solutions. U.S. Pat. No. 3,565,702 shows one embodiment. Another embodiment, with circular crucible and a circular slider, is shown in U.S. Pat. No. 3,881,037. For certain applications, these systems have the drawback of relatively complicated structure, of requiring high precision machined parts and of moving, with the substrate, an amount of a solution which then mixes with another solution. Also, the time of contact between substrate and solutions cannot be made sufficiently short. Also, as a result of abrasion of crucible parts, which slide upon each other, the solutions can become contaminated and the substrates, in particular epitactic layers, may be damaged by mechanical influences.

In another group of systems, the exchange of solutions on the semiconductor substrate is done by rocking. An example of this group is shown in IBM Technical Disclosure Bulletin, volume 14, No. 9, page 2850. Although this apparatus shows little admixture of solution residues with the subsequent solution, the contact time, however, is too long for many applications.

A third class of devices is provided with rotating crucibles in which the transport of liquids is by means of gravity. One example is shown in U.S. Pat. No. 3,858,553, another one in IBM Technical Disclosure Bulletin, volume 18, No. 5, page 1585. The crucibles rotate slowly and contact times between substrates and solutions are long. In more recent designs, there is a trend to shorten the contact time by employing centrifugal forces besides the force of gravity. The paper by Bauser, Schmid, Lochner and Rabe, in Japanese Journal of Applied Physics, volume 16, 1977, supplement 16/1, pages 457 through 460, as well as literature cited there, describe examples of such devices. The crucible by Bauser et al. allows short contact times between various solutions and semiconductor substrates. Furthermore, the solutions are recovered for further use without essential mutual mixture. A disadvantage can be seen in that the crucible consists of many parts, which need precise machining. During operation, the parts within the crucible slide upon each other, thus giving cause to contamination of the liquids. Finally, under the influence of centrifugal force, the solutions repeatedly are forced to flow through narrow gaps which would stop normal flow due to surface tension of the solution. Therefore, solutions of high surface tension cannot be used.

SUMMARY OF THE INVENTION

The object of the present invention is an apparatus for the manufacture of multi-layered semiconductor devices by means of liquid phase epitaxy. The apparatus is particularly simple and durable. It can hold two or more different solutions which are brought into contact, one after another, with semiconductor substrates without substantial intermixing. This allows the manufacture of multi-layer structures with a set of layers repeating as often as desired. Furthermore, the apparatus is suitable for extremely short contact times between each solution and the substrates. The flow rate of solution, and therefore the contact time, can be varied within wide limits. The simple design allows higher rotational speeds and the ensuing centrifugal forces are used to provide effective drying of the substrates after each contact with each solution. The high acceleration can also be used to oversaturate solutions under certain conditions. One embodiment operates by means of centrifugal force only, i.e. without the presence of gravitational forces and therefore appears suitable for space application.

According to the invention, the foregoing objects are achieved by means of a crucible containing several chambers that are interconnected with each other by channels. The chambers as well as the channels are arranged with regard to the rotational axis of the crucible so that upon changing rotational speed of the crucible the liquids flow from one chamber through a channel into the next chamber without mutually mixing.

The foregoing and other objects, features and advantages of the invention will be apparent from the following and more particular description of preferred embodiments of the invention, as illustrated in the accompanying drawings.

DESCRIPTION OF THE PREFERRED EMBODIMENTS

Figure 1:
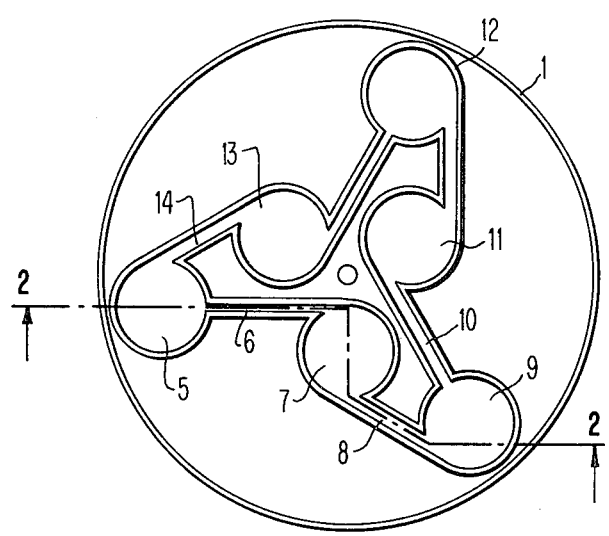
FIGS. 1 and 2 illustrate schematically a top view and cross-section of a first embodiment of the rotatable crucible.
Figure 2:
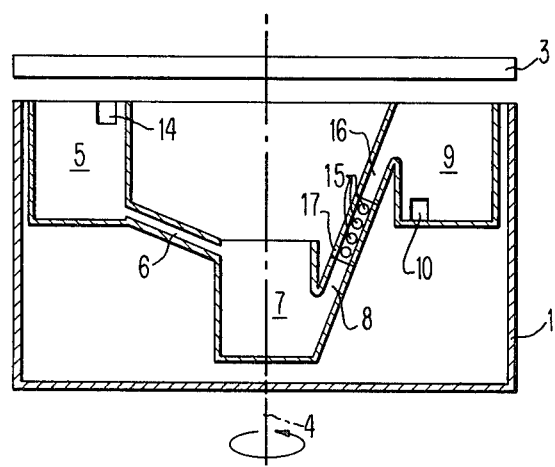

FIG. 1 shows a crucible or reactor 1 which contains six chambers. The crucible is a rotatable and preferably of round configuration attached to the upper end of a vertically arranged rotatable axis. While FIG. 1 gives a top view of the crucible, FIG. 2 shows a cross section along the line 2—2, which is arranged to show three chambers within the crucible and the interconnecting channels. As can be seen, the chambers which, together with the channels, constitute a closed loop, are arranged alternately close to the axis and the bottom of the crucible, or close to the circumference and the top of the crucible. The connecting channels always lead from the bottom of one chamber to the top of the subsequent chamber.

The described arrangement has the effect that a liquid, which assumedly is in top chamber 5, under the influence of gravitational forces flows through channel 6 into bottom of lower chamber 7. If the crucible now is rotated sufficiently rapidly around the axis indicated at 4, the resulting centrifugal force will drive the liquid out of chamber 7 through channel 8 into chamber 9. As long as the centrifugal force persists, the liquid will remain in chamber 9. If rotation of the crucible is slowed, the force of gravity will eventually overcome the centrifugal force and the liquid will flow or drain from chamber 9 through drain channel 10 into chamber 11. If the start/stop sequence of rotation of the crucible around axis 4 is continued, the liquid will flow from chamber 11 through chamber 12 and 13, eventually back into chamber 5. The circle can be repeated at will. It is obvious that several different liquids contained in chambers 5, 9 and 12, will be caused by repeated start/stop cycles to flow within the crucible without mixture between the various liquids.

The drawing of the crucible in FIGS. 1 and 2 is essentially simplified for ease of understanding. The crucible consists of a material suitable for conditions of liquid-phase epitaxy. Suitable materials are e.g. graphite, ceramics, silica glass, glass, stainless steel, etc. It is known to one skilled in the art how suitable materials are selected for each application. The crucible is attached to a rotatable axis which is only indicated by its center line 4. The axis is supported in appropriate bearings (not shown) below and/or above the crucible and is connected to a drive, e.g. an electrical induction motor. The crucible may comprise a cover, indicated by 3 in the drawing, which sits loosely on top of the crucible edge, or is attached thereto by suitable means. The cover also may, according to the application, be sealed hermetically. Normally, the crucible also requires a well-controlled heating. For example, it can be disposed within a vertical silica glass tube surrounded by an induction heating coil. The silica glass tube may be closed and contain a protective atmosphere. Alternately, the crucible may be evacuated or filled with a protective atmosphere through a hollow axis. Since all these details as well as many others are known to one skilled in the art, they are only mentioned here and not described. The substrates 15, on which epitactic layers are to be grown, are attached to a strip-like substrate holder 16. The substrate holder is inserted into an ascending channel. In FIG. 2, holder 16 is shown inserted into channel 8. Besides substrates 15, the strip may comprise a flow rate reduction or throttling means 17 (e.g. a valve) which reduces the cross-section of the channel and thereby reduces the flow rate of the liquid. Optionally, substrate holder 16 may be positioned in each of the ascending channels.

For operation of the device, the wafer loaded substrate holders are inserted into the channels and the chambers are filled with the required solutions. If, for example, gallium arsenide substrates are to be covered alternately by P- and N-conductive layers, gallium arsenide containing a conductivity determining substance or the components of such a substance is dissolved in a gallium melt. In one of the inner bottom chambers, a gallium melt with dissolved P-conductive gallium arsenide is introduced, and another chamber provided with a melt of dissolved N-conductive gallium arsenide. The crucible is now heated until the components are completely dissolved, and by control of temperature or, sometimes by means of "saturation substrates", a saturated solution is prepared. The solution is then supersaturated by carefully lowering the temperature, either in steps or continuously. Sometimes it is desirable to remove portions or irregular substrate surfaces by dissolving some substrate material. If this state is reached, the before-described start/stop cycles may be begun. This will cause alternatively the first supersaturated solution melt and then the other one to wash past the substrates. In each pass of a melt, an epitactic layer will grow on the substrates. The process is repeated until the desired number of layers has grown. Now, or possibly after a cool-down period, the substrate holder with the attached substrates is removed from the crucible. Another substrate holder with new substrates may be inserted for further epitactic deposition.

During liquid-phase epitaxy by means of the above-described apparatus, layers of both conductivities are deposited epitactically in alternation on gallium arsenide substrates. The deposition usually occurs at temperatures between 600° and 900° C. from a supersaturated solution. The solution consists of liquid gallium in which doped gallium arsenide is dissolved. Supersaturation of the solution is achieved by controlled lowering of the temperature. In the embodiment, of the crucible as just described, up to three solution melts may circulate a tone time. The melts will alternatively wash past the substrates at a high flow rate during a short, well defined time, thereby depositing a new epitactic layer each time. There is substantially no intermixing between the solutions because after transport of a solution from one chamber to the next, no residue remains. The substrates also retain no significant residual solution since they are dried substantially under the influence of centrifugal force. As opposed to hereto known apparatus, this device has no mutually moving parts and therefore no friction between surfaces which would constitute a contamination risk for the solutions. It is advantageous to make the crucible from a material which is not wetted by the solutions, e.g. graphite, if a solution of gallium arsenide in gallium is used. Because of their surface tensions, the solutions will not enter ascending channels as long as the crucible stands still. Only when a threshold rotational speed is attained, the centrifugal force will then overcome the surface tension of the liquid as the latter enters the channel. The liquid then experiences the acceleration $b_z$ according to the formula: $b_z = r\phi^2$, whereby r is the distance from the center axis and $\phi$ the angular velocity of the crucible in rad/s. At the time t therefore $r = r_0 \cdot \cosh \phi t$ and the flow rate $V = r_0 \cdot \phi \cdot \sinh \phi$, e.g. in other words the flow rate increases almost exponentially. At a rotational speed $\phi = 3000$ rpm $= 300$ rad/s and $r_0 = 5$ cm, the flow rate $V = 1500$ cm/s·sinh 300·t. That means, after 3 milliseconds, $V = 1500$ cm/s at a radius of 8 cm. Because of friction and viscosity, the flow rate is somewhat lower.

Since the flow rate increases rapidly in the channel, there may be a problem of a too rapid current flow if the cross-section of the channel is uniform. Therefore, it is advantageous to design the channel so that, in the direction of flow, its cross-section decreases proportionally to the reciprocal value of the speed of liquid. This measure is not necessary, however, if the crucible is designed to hold substrates in the chambers rather than in the channels.

Figure 3:
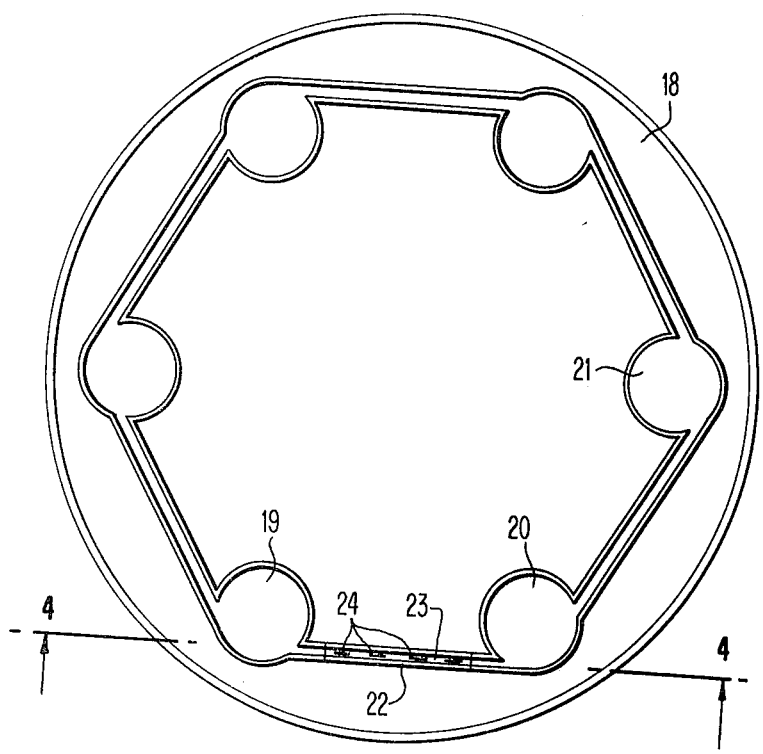
FIGS. 3 and 4 illustrate schematically a top view and cross-section of a second embodiment of a rotatable crucible.

FIG. 3 shows the second embodiment of the device. Since the transport of liquids here is due solely to the change between rotational acceleration and centrifugal force, gravity is not required at all. This embodiment can be used therefore in a gravitation-free space or environment.

Figure 4:
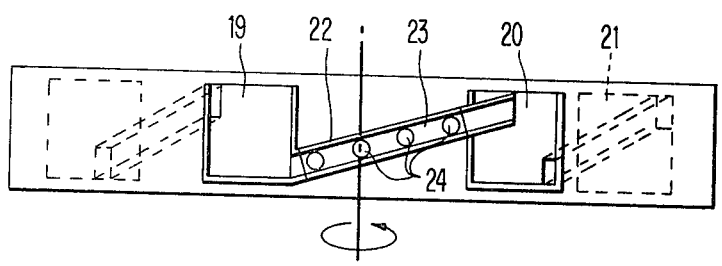

Crucible 18, as shown in FIGS. 3 and 4, is rotatable around an axis which is not shown but only indicated by line 26, similar to the embodiment of FIGS. 1 and 2. Crucible 18 can also be heated and can be opened for insertion as well as removal both of liquids and substrates. Since these particulars are not only known to one skilled in the art but have also been discussed with reference to FIGS. 1 and 2, no more discussion need be made here. Crucible 18 contains six chambers, i.e. 19, 20, 21 etc. which are interconnected by channels 22. Strip-like substrate holders 23 holding substrates 24 are arranged within the channels.

In contrast to crucible 1, the chambers of crucible 18 are spaced at the same distance from the crucible axis 26. The transport of liquid, which in crucible 1 occurs by alternate action of gravitational and centrifugal force, now occurs by alternating rotational velocity. A liquid contained in chamber 19 will, if the crucible rotates counterclockwise, collect at the peripheral side of the chamber. If braking occurs, i.e. a counterclockwise rotational acceleration of the liquid will flow through channel 22 into chamber 20. The liquid thereby washes past the substrates 24, which are attached to substrate holder 23, and thereby deposits an epitactic layer on these substrates. Channel 22 leads from one end surface of the cylindric chamber 19 to the other end surface of cylindric chamber 20. The channel leaves chamber 19 almost radially of its axis while entering tangentially into chamber 20. The liquid, which flows through channel 22 at high speed, is led into chamber 20 in a spiral flow. This has the effect that the liquid does not pass chamber 20 immediately in direct flow into chamber 21 but rather circulates within the chamber in a spiral fashion. The cycle times of the acceleration start/stop cycle are adjusted so that the deceleration, under the influence of which the liquid flows through channel 22, will be about zero when the liquid enters chamber 20. Due to its tangential guiding, the kinetic energy of the entering liquid is controlled. It is obvious that acceleration times and amount of liquids have to be determined in considering the speed of flow, viscosity and other parameters that all have to match, to avoid a mutual mixing of several liquids existing in several chambers of crucible 18. If, for example, the volume of a liquid at most equals the volume of a channel 22, the liquid, which travels e.g. from chamber 19 into chamber 20, will arrive there only after the liquid, which has previously occupied chamber 20, is completely evacuated. Therefore, if the volume of the channels should be kept low, it is advantageous to fill each second chamber only with liquid in order to avoid any mixing of liquids.

Figure 5:
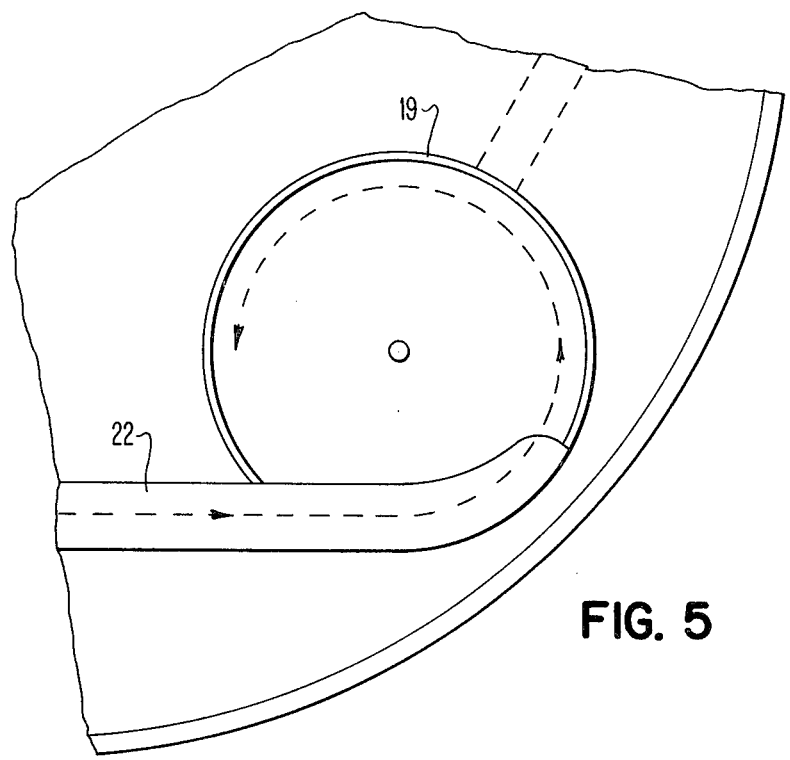
FIGS. 5 and 6 illustrate schematically sections of a crucible chamber.
Figure 6:
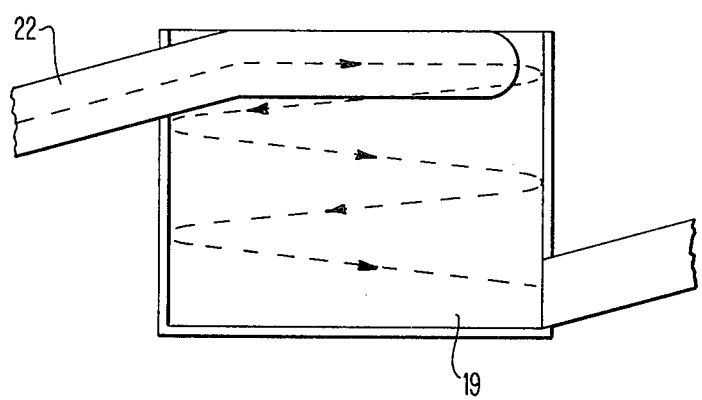

Transport of liquids, which is caused by periodic increase and decrease of revolution per minute in one and the same direction, can as well be caused by a periodic change of direction. It is essential only that the change of acceleration in amount as well as in time is adapted to the flow rate of the liquid. FIGS. 5 and 6 show a cross-section vertically to the cylinder axis of chamber 19, as well as a section parallel to the axis. All other chambers of the crucible are identical. The dashed line in the incoming channel 22 shows how the liquid flows through the channel under the influence of acceleration, how it is led tangentially into chamber 19 and then spirals along the wall in order to decelerate. Deceleration is necessary to ascertain that the liquid does not flow into the outlet channel before the solution is entirely evacuated, in the same cycle, from the preceding chamber. The liquid rotates within the chamber sufficiently long to overcome the counter acceleration of the crucible, i.e. to attain the rotational speed necessary to transport the liquid through the next channel in the subsequent cycle.

It is readily appreciated that very high acceleration forces can be applied in the last described embodiment. If the total diameter of the crucible is in the range of 10 to 30 cm, rotational speeds in the order of 5000 rpm are possible without difficulty. The speed variations, necessary for liquid transport are small in comparison. The high resulting centrifugal forces also help to break oxide layers that may build up on the liquid surfaces since the density of oxide is low as compared to that of the solution. Furthermore, oversaturation of solutions may be controlled by rotational speed, i.e. by centrifugal force if the solution and the dissolved substance are of different specific weight.

Figure 7:
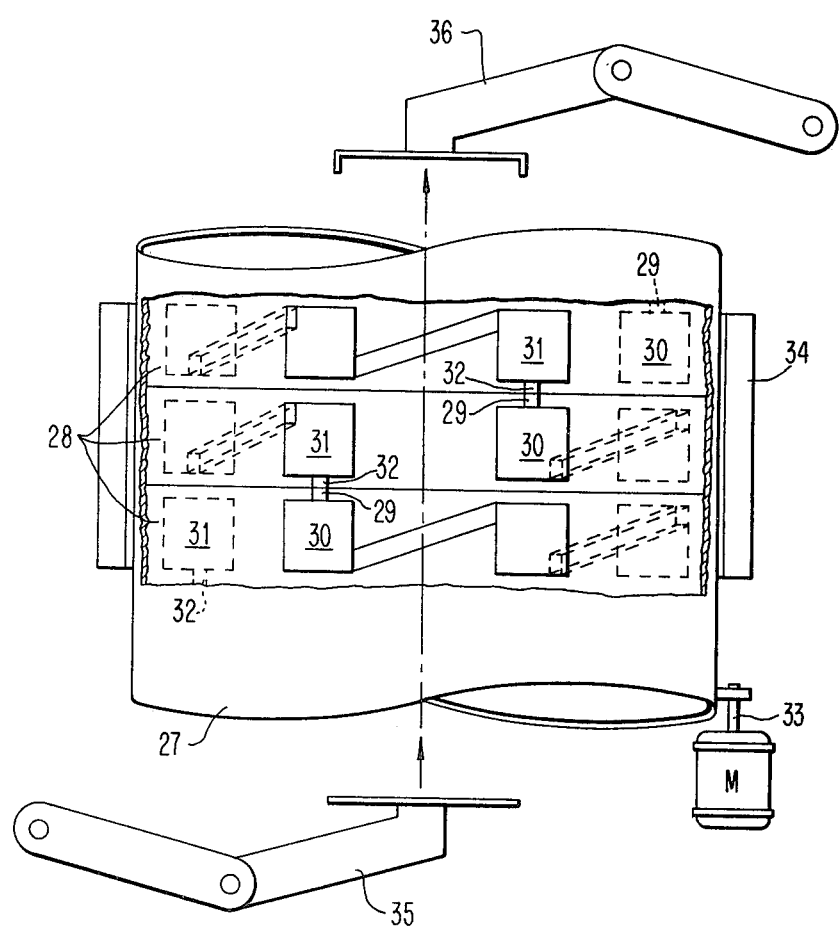
FIG. 7 illustrates schematically a cross-section of an embodiment for continuous manufacture.

The chambers which are described in cylindric form in the drawings may have many other shapes, e.g. that of a sphere. The embodiment according to FIG. 7 is suitable for the manufacture of semiconductor elements in large numbers in a continuous process. The device is shown in a cross-sectional view and in simplified form. Within a tube-like rotatable furnace 27, e.g. a rotatable susceptor of graphite or metal with a non-rotatable high frequency induction coil 34, a stack of equal crucibles 28 is arranged so that the rotation of the furnace around its vertical axis is transferred to the crucibles. A loader indicated by 35 feeds pre-heated crucibles one after the other from the bottom into the furnace where they are heated with sufficient precision to process temperature, then moved through the process and finally removed by a similar unloader 36 from the top of the furnace. Inserting as well as removal of crucibles is preferably made in a moment of stopped rotation.

The crucibles are functionally similar to those described with reference to FIGS. 3 to 6. There is the difference, however, in that a vertical connecting inlet pipe 29 leads into the first chamber 30 of each crucible from the top. A matching connecting outlet pipe 32 leaves the last chamber 31 of each crucible at the bottom. Furthermore, there is no connecting channel between neighboring chambers 31 and 30. The chambers and channels of the crucible do not constitute a closed cycle, in contrast to previously described embodiments. The liquids flow through each chamber of each crucible once in order to flow from the last chamber into the first chamber of the next lower crucible. Rotational motion of the furnace, or the stack of crucibles, respectively, is controlled in connection with the rise of the crucible stack so that the solutions are always at the same level with relation to the heating zone. Rising crucibles, therefore, travel from a pre-heating zone in the lower part of the furnace through a zone of epitactic deposition in the center region of the furnace into a cool down zone in the upper region. The solutions which cause deposition of epitactic layers are always kept in the center region, i.e. the deposition region. Crucibles are inserted from the bottom into the pre-heating region and withdrawn at the top from the cool down region. The process continues without interruption until the liquids are consumed or depleted. They may be withdrawn in a crucible which contains no substrates, and may be replaced by new liquids in a similar way.

Drive motor 33 is indicated to set the furnace 27 into rotation. Crucibles 28, e.g. may be guided by tracks and corresponding recesses. Induction heater 34 heats the crucibles to the necessary temperature. A feed arm 35 feeds new pre-heated crucibles and a second unloader arm 36 removes crucibles that have passed the process. Semi-conductor devices with many different layers may be made in great numbers at low cost by means of the embodiment depicted in FIG. 7. The process is practically a continuous one, as even an exchange or replenishment of liquids does not cause considerable interruption.

While the invention has been particularly shown and described with reference to preferred embodiments thereof, it will be understood by those skilled in the art that changes in form and detail may be made therein without departing from the spirit and scope of the invention.

What is claimed is:

1. Apparatus for transfer of liquids between chambers of a reactor comprising:
    a plurality of interconnected discrete reactor chambers circumferentially spaced on a common horizontal plane, with said chambers defining an annular array disposed about a vertical axis, with said interconnection comprising
    conduit means extending between the bottom of one of said chambers and the top of a succeeding and adjacent second one of said chambers; and
    means to rotate said chambers about said axis under sufficient speed to force a liquid to flow under centrifugal force through said conduit means from the bottom of said one chamber means to the top and into said second one of said succeeding chambers.

2. The apparatus of claim 1 including means to mount a workpiece in said conduit means for flow of said liquid across said workpiece.

3. The apparatus of claim 2 wherein said workpiece is a semiconductor substrate, and said liquid is an epitaxy source solution.

4. The apparatus of claim 1 adapted to contain dissimilar liquids in different ones of said chambers.

5. The apparatus of claim 1 including means to throttle the flow of liquid in said conduit means.

6. The apparatus of claim 1 including a plurality of said annular arrays of reactor chambers disposed in vertically superposed and coacting relationship to one another for sequentially indexing liquid downwardly through a vertical work zone from one said annular array to an adjacent lower said annular array,
    an outlet at the bottom of a prespecified last chamber of a one said annular array,
    an inlet at the top of a prespecified first chamber in a succeeding adjacent lower annular array, and
    means to register said outlet and said inlet in interconnection with each other to enable drain flow of liquid from said last chamber to said first chamber.

7. Apparatus for transfer of liquids between chambers of a reactor, comprising:
    (A) a first plurality of interconnected discrete reactor chambers circumferentially spaced on a first common horizontal plane at a first level and defining a first annular array disposed about a vertical axis;
    (B) a second plurality of interconnected discrete reactor chambers circumferentially spaced on a second common horizontal plane defining a second annular array of a plurality of discrete chambers disposed
        (a) radially between said first array and said axis, and
        (b) at a second level below that of said first array;
    (C) conduit means sequentially interconnecting in a direction of rotation about the vertical axis
        (a) the bottom of a first chamber in said second array to the top of an adjacent chamber in said first array, and
        (b) the bottom of said adjacent chamber of said first array to the top of the next succeeding adjacent chamber in said second array; and
    (D) means to simultaneously rotate said chambers of said first array and said second array about said axis under sufficient speed to force a liquid to flow under centrifugal force through said conduit means from the bottom of the said first chamber in said second lower level array to the top of the said adjacent chamber in said first level array.

8. The apparatus of claim 7 including means to mount a workpiece in said conduit means for flow of said liquid across said workpiece.

9. The apparatus of claim 8 wherein said workpiece is a semiconductor substrate, and said liquid is an epitaxy source solution.

10. The apparatus of claim 7 adapted to contain dissimilar liquids in different ones of said chambers.

11. The apparatus of claim 7 including means to throttle the flow of liquid in said conduit means.

12. The apparatus of claim 7 including means to periodically reduce said rotational speed of said chambers to facilitate gravitational flow of fluid from chambers in said first array to the lower chambers of said second array.

* * * * *